United States Patent
Liao et al.

(10) Patent No.: US 11,906,596 B2
(45) Date of Patent: Feb. 20, 2024

(54) SYSTEM-SIDE BATTERY HEALTH GAUGE AND METHODS

(71) Applicant: MediaTek Inc., Hsinchu (TW)

(72) Inventors: Chi Cheng Liao, Hsinchu (TW); Jia-You Chuang, Hsinchu (TW); Jui-Chi Wu, Hsinchu (TW)

(73) Assignee: MediaTek Inc., Hsinchu (TW)

( * ) Notice: Subject to any disclaimer, the term of this patent is extended or adjusted under 35 U.S.C. 154(b) by 29 days.

(21) Appl. No.: 17/547,181

(22) Filed: Dec. 9, 2021

(65) Prior Publication Data
US 2022/0206079 A1 Jun. 30, 2022

Related U.S. Application Data

(60) Provisional application No. 63/130,436, filed on Dec. 24, 2020.

(51) Int. Cl.
*G01R 31/392* (2019.01)
*G01R 31/367* (2019.01)

(52) U.S. Cl.
CPC ......... *G01R 31/392* (2019.01); *G01R 31/367* (2019.01)

(58) Field of Classification Search
CPC .............................. G01R 31/392; G01R 31/367
See application file for complete search history.

(56) References Cited

U.S. PATENT DOCUMENTS

| | | | |
|---|---|---|---|
| 10,424,961 B1 * | 9/2019 | Maluf | H02J 7/00041 |
| 10,942,223 B1 * | 3/2021 | Malloy | B60L 58/16 |
| 11,415,630 B2 * | 8/2022 | Dubarry | G01R 31/392 |
| 2009/0027056 A1 * | 1/2009 | Huang | G01R 31/392 320/132 |
| 2012/0068715 A1 | 3/2012 | Martaeng | |
| 2013/0066573 A1 * | 3/2013 | Bond | G01R 31/392 324/426 |
| 2014/0306712 A1 * | 10/2014 | Esnard-Domerego | G01R 31/392 324/426 |
| 2017/0115355 A1 * | 4/2017 | Willard | G01R 31/3648 |
| 2019/0170826 A1 * | 6/2019 | Shoa Hassani Lashidani | G01R 31/367 |
| 2019/0202416 A1 * | 7/2019 | Lai | B60L 53/68 |
| 2020/0014218 A1 * | 1/2020 | Maluf | H02J 7/00041 |

OTHER PUBLICATIONS

Z. Xia and J. A. Abu Qahouq, "State-of-Charge Balancing of Lithium-Ion Batteries With State-of-Health Awareness Capability," in IEEE Transactions on Industry Applications, vol. 57, No. 1, pp. 673-684, Jan.-Feb. 2021, doi: 10.1109/TIA.2020.3029755. (Year: 2021).*

(Continued)

*Primary Examiner* — Raymond L Nimox
(74) *Attorney, Agent, or Firm* — Tong J. Lee

(57) ABSTRACT

A device estimates the health of a battery by first collecting measurements of the battery over multiple charging and discharging cycles. Scores are assigned to the measurements according to scoring rules stored in a memory of the device. The device calculates battery based on an average of the measurements, where each measurement has an assigned score greater than a threshold.

20 Claims, 5 Drawing Sheets

(56) References Cited

OTHER PUBLICATIONS

T.-H. Wu, J.-K. Wang, C.-S. Moo and A. Kawamura, "State-of-charge and state-of-health estimating method for lithium-ion batteries," 2016 IEEE 17th Workshop on Control and Modeling for Power Electronics (COMPEL), Trondheim, Norway, 2016, pp. 1-6, doi: 10.1109/COMPEL.2016.7556688. (Year: 2016).*

P. Ananto et al. "The state of health of Li—Po batteries based on the battery's parameters and a fuzzy logic system," 2013 Joint International Conference on Rural Information & Communication Technology and Electric-Vehicle Technology (rICT & ICeV-T), Bandung, Indonesia, 2013, pp. 1-4 (Year: 2013).*

* cited by examiner

Measurement Rules

Trigger Condition (TC1):
suspend t1 minutes; and
fully charged or fully discharged

Trigger Condition (TC2):
suspend t2 minutes; and
SOC = 70%

Trigger Condition (TC3):
suspend t3 minutes; and
SOC = 30%

Score Table (Scoring Rules)

| Scoring Factor | Per-factor Quality Point |
|---|---|
| Fly mode (enabled/disabled) | P1 |
| Execution time length | P2 |
| Battery temperature range | P3 |
| Battery capacity range | P4 |
| Suspend time length | P5 |
| Number of cycles | P6 |
| Average current range | P7 |
| Voltage range | P8 |
| Coulomb difference range | P9 |
| . . . . | . . . . |

FIG. 5

SYSTEM-SIDE BATTERY HEALTH GAUGE AND METHODS

CROSS-REFERENCE TO RELATED APPLICATIONS

This application claims the benefit of U.S. Provisional Application No. 63/130,436 filed on Dec. 24, 2020, the entirety of which is incorporated by reference herein.

TECHNICAL FIELD

Embodiments of the invention relate to battery health monitoring and measurements.

BACKGROUND

Rechargeable batteries are commonly used in modern electronic devices. To avoid unexpected device shutdown and to optimize device power and performance, a device typically includes a battery monitoring system to monitor battery states such as the state of charge (SOC) and the state of health (SOH). The SOC is the ratio of the remaining capacity (in milli-ampere-hour (mAh)) to the maximum available capacity (Cmax) of the battery. A battery is fully charged when the SOC is 100%; it is fully discharged when the SOC is 0%. However, Cmax decreases as the battery ages. As an example, a 100% SOC of an aged battery may be equivalent to a 75%-80% SOC of a new battery.

The SOH is the ratio of Cmax to the rated capacity of a battery. The rated capacity, which is usually provided by a battery manufacturer, is a new battery's maximum capacity. That is, Cmax is equal to the rated capacity when the battery is new. The SOH of a battery indicates the battery's ability to store and release electrical power compared with a new battery. The SOH of a new battery is 100%, and the SOH declines as the battery ages. When the SOH is below a threshold, it may be necessary to replace the battery.

Accurate SOC and SOH estimations can prevent unexpected shutdowns and improve system performance and reliability. A conventional method uses measured battery voltage to look up a pre-determined charge/discharge voltage curve to thereby estimate the remaining battery capacity. However, the voltage curve changes as the battery ages. Generating lookup tables (e.g., open-circuit voltage (OCV) tables) for aged batteries can be time-consuming and may not be adaptable to all batteries. Thus, there is a need for improving battery monitoring techniques to improve the quality of estimated battery health.

SUMMARY

In one embodiment, a method is provided for a device to estimate battery health. According to the method, measurements of a battery are collected over multiple charging and discharging cycles. Scores are assigned to the measurements according to scoring rules stored in a memory of the device. Battery health is calculated based on an average of the measurements, where each measurement has an assigned score greater than a threshold.

In another embodiment, a device is operative to estimate battery health. The device includes a battery; a measurement system to collect measurements of the battery over multiple charging and discharging cycles; a memory to store scoring rules; and a processing system. The processing system is operative to: assign scores to the measurements according to scoring rules stored in the memory; and calculate battery health based on an average of the measurements. Each measurement has an assigned score greater than a threshold.

Other aspects and features will become apparent to those ordinarily skilled in the art upon review of the following description of specific embodiments in conjunction with the accompanying figures.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

FIG. 4 illustrates an example of measurement rules for collecting battery measurements according to one embodiment.

FIG. 5 illustrates an example of a score table for scoring battery measurements according to one embodiment.

DETAILED DESCRIPTION

In the following description, numerous specific details are set forth. However, it is understood that embodiments of the invention may be practiced without these specific details. In other instances, well-known circuits, structures, and techniques have not been shown in detail in order not to obscure the understanding of this description. It will be appreciated, however, by one skilled in the art, that the invention may be practiced without such specific details. Those of ordinary skill in the art, with the included descriptions, will be able to implement appropriate functionality without undue experimentation.

Embodiments of the invention provide a mechanism for determining the battery health of a battery-operable device. The battery health may be indicated by a state-of-health (SOH) indicator displayed on the screen of the device. In one embodiment, the device includes a battery health gauge to determine or estimate the battery health based on measurements of the battery. The device collects measurements of the battery during normal use of the battery and the device. The battery health gauge uses a scoring algorithm to assign a score to each measurement. The measurements having low scores (i.e., lower than a predetermined threshold) may be disregarded. The battery health gauge calculates the battery health based on a combination (e.g., an average) of the measurements. The scoring algorithm may include the evaluation of a set of scoring rules.

In one embodiment, the battery health gauge may update the scoring rules based on the measurements and/or other indications to improve accuracy. For example, from monitoring, measurements, and analysis of battery usage, the battery health gauge may identify an update indication prompting an update to the scoring algorithm, such as adding new scoring rules tailored to the device or the device usage. The update may be determined by the battery health gauge based on an analysis of the measurements. Alternatively, the battery health gauge may upload the measurements to a remote server system, which performs analysis and sends an update to the device.

Figure 1:
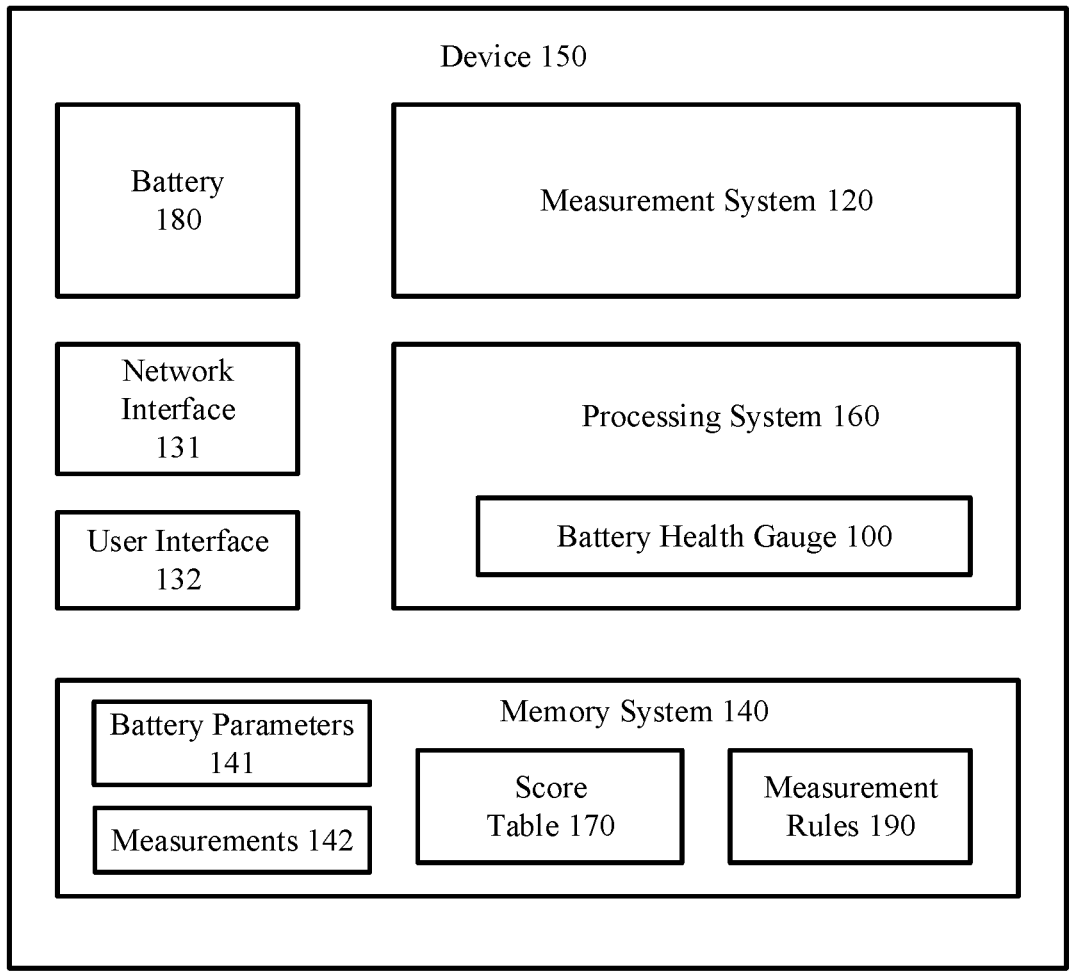
FIG. 1 is a block diagram illustrating a device operable to estimate battery health according to one embodiment.

FIG. 1 illustrates a device 150 including a battery health gauge 100 according to one embodiment. The battery health gauge 100 operates to determine the health of a battery 180 that powers the device 150. In one embodiment, the device 150 may be a battery-powered mobile device, computer, phone, watch, console, appliance, machine, vehicle, etc. The battery 180 supplies power to electronic circuitry in the device 150.

In this embodiment, the device 150 includes a measurement system 120, a memory system 140, a processing system 160, and the battery 180. The measurement system 120 includes circuitry to detect and measure operating states of the battery 180; e.g., voltage, temperature, and/or current. The memory system 140 includes one or more volatile and/or nonvolatile memory devices. The processing system 160 includes one or more processors and other electronic circuits, such as programmable and/or special-purpose circuitry. The processing system 160 is coupled to the memory system 140 to access (i.e., read and write) data stored in the memory system 140. The battery 180 is a rechargeable battery that includes one or more battery cells. Examples of a battery cell include, but are not limited to a lead-acid battery cell, a lithium-ion battery cell, a nickel-cadmium battery cell, or another type of rechargeable battery cell.

In the embodiment of FIG. 1, the battery health gauge 100 is part of the processing system 160. Thus, the battery health gauge 100 is a "system-side" gauge that may be implemented by programmable hardware, firmware, and/or software executed by hardware circuits in the processing system 160. A system-side gauge (such as the battery health gauge 100) is different from a fuel gauge integrated circuit (IC), which integrates the functionalities of battery measuring, monitoring, and power management in one special-purpose dedicated IC. Such a fuel gauge IC is typically supplied by a third-party vendor and can be costly and not easily updated. The system-side battery health gauge 100 disclosed herein provides a low-cost solution for battery health monitoring and can be easily updated according to new information collected from the battery 180 and/or from other batteries of the same type. Algorithms, rules, and parameters used by the battery health gauge 100 can be updated based on battery measurements and/or data supplied by a backend server system. Thus, the battery health gauge 100 is adaptable to changing characteristics of the battery 180.

In one embodiment, the memory system 140 stores battery parameters 141 and measurements 142. The battery parameters 141 may include battery characteristic data; e.g., curves depicting the open-circuit voltage (OCV) vs. the SOC of a new battery. The curves may be stored in the data structure of tables. The battery parameters 141 may be supplied by a battery manufacturer. The measurements 142 are provided by the measurement system 120. The memory system 140 further includes a score table 170, which stores a set of scoring rules or scoring algorithms for assigning scores to the measurements 142. The scores may be used as weights to indicate the degree of importance of each measurement. The memory system 140 further includes a set of measurement rules 190, which specify trigger conditions for collecting the measurements 142. In one embodiment, a set of pre-defined scoring rules are loaded into the memory system 140 when the device 150 is manufactured.

The device 150 may also include interfaces such as a network interface 131 and a user interface 132. Among other functionalities, the user interface 132 may display the estimated battery health to a user. The network interface 131 may further include a wireless network interface and/or a wired network interface. The network interface 131 may be used for communicating with a backend remote server system to receive software or data updates; e.g., updates to the score table 170 and/or the measurement rules 190. In one embodiment, the device 150 may upload a portion or all of the measurements 142 to the server system via the network interface 131. The server system may analyze the uploaded measurements and provide the updates to the device 150 for improving the battery health estimation. The server system may further analyze measurements uploaded from other devices having batteries of the same type (e.g., same model, same age, etc.) to generate the updates, and send the updates to the device 150. The updates help the battery health gauge 100 to improve the accuracy of the battery health estimation.

Alternatively or additionally, the device 150 can analyze the measurements 142 locally. By analyzing the measurements 142, the battery health gauge 100 can detect an update indication; e.g., when the battery 180 has finished N complete charging cycles, when the maximum available capacity (Cmax) of the battery 180 has degraded in a consecutive number of measurement cycles, etc. Based on the analysis, the battery health gauge 100 can update the score table 170 to adjust the scores assigned to different measurements. The battery health gauge 100 may also update the measurement rules 190 to adjust the trigger conditions that define when to collect battery measurements. The battery health gauge 100 may also add new scoring rules to enhance the pre-defined scoring rules in the score table 170; e.g., by tightening the data range and its corresponding quality point. For example, if a pre-defined scoring rule assigns a quality point 60 to a measurement in which the battery temperature changes in the range of 3-5 degrees Fahrenheit, a new rule added by the battery health gauge 100 may assign a quality point 80 (i.e., higher quality) to a measurement in which the battery temperature changes in the range of 2-4 degrees Fahrenheit. Examples of the scoring rules and the corresponding quality points are provided with reference to FIG. 5. In one embodiment, the device 150 may learn to determine the quality point of these new rules by machine learning based on the past battery measurements.

Thus, as the battery 180 ages, the battery health gauge 100 can adjust the estimated battery health by changing how the battery measurements are collected and scored. The adjustment can be performed continuously during the battery lifespan. Thus, the battery health estimation can keep improving as more and more battery measurements are collected and analyzed.

Figure 2:
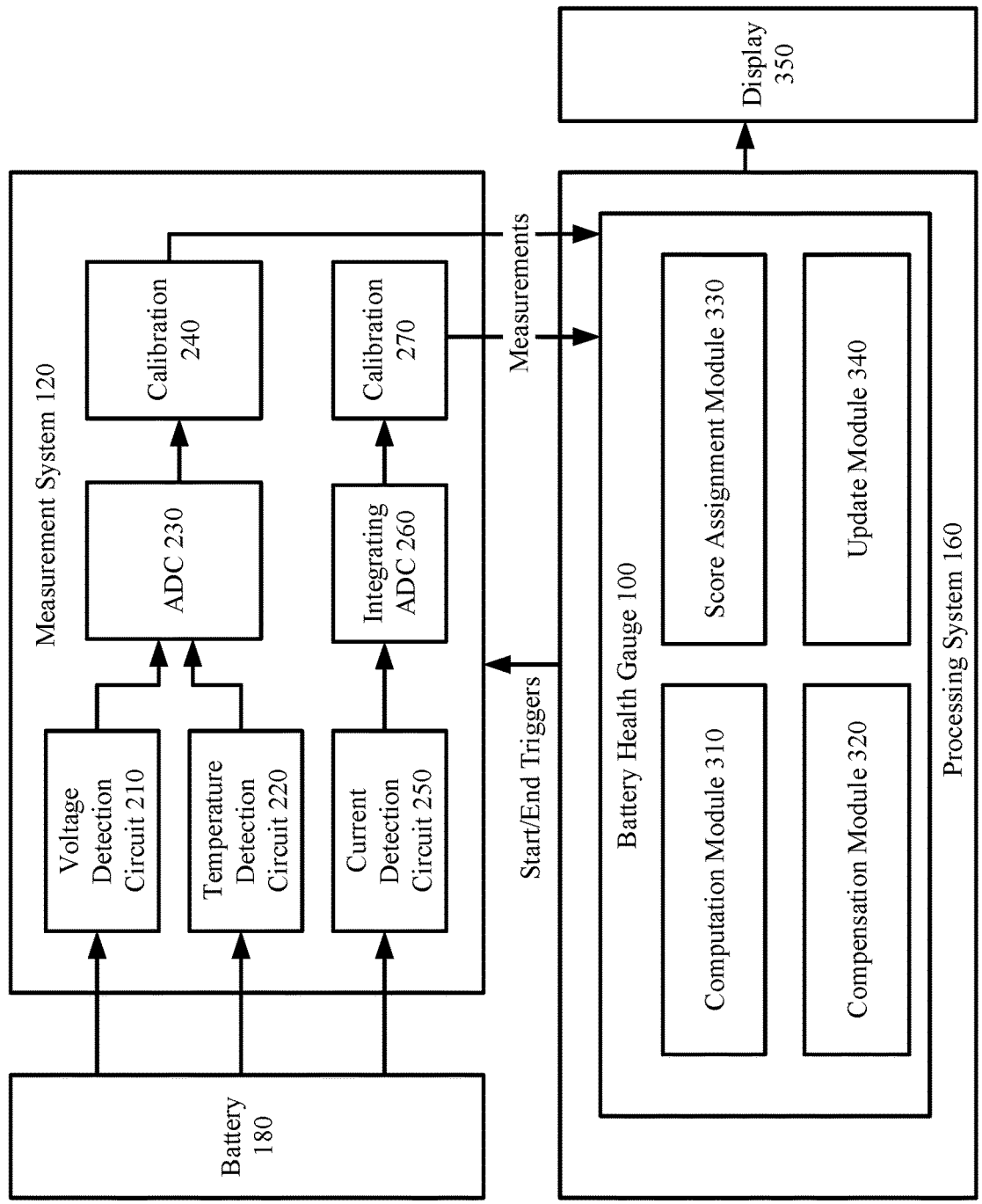
FIG. 2 is a block diagram illustrating a battery health gauge according to one embodiment.

FIG. 2 is a block diagram illustrating further details of the battery health gauge 100 according to one embodiment. Additional details of the measurement system 120 are also provided. The measurement system 120 includes a voltage detection circuit 210 and a temperature detection circuit 220. Signals measured by the voltage detection circuit 210 and the temperature detection circuit 220 are converted from analog into digital form by an analog-to-digital converter (ADC) 230 and then calibrated by a calibration circuit 240 to cancel an offset or error that may be caused by the voltage detection circuit 210, the temperature detection circuit 220, and/or the ADC 230. In one embodiment, the measurement system 120 further includes a current detection circuit 250 to measure the current flowing in (charging) or flowing out (discharging) the battery 180. The measured current is converted from analog into digital form by an integrating ADC 260, which integrates the measured current over a time period. A calibration circuit 270 cancels an offset or error that may be caused by the current detection circuit 250 and/or the integrating ADC 260. The output of the calibration circuit 270 indicates the capacity change in the battery 180 over the time period of the current integration. In one embodiment, a coulomb counting circuit may implement the functionalities of the current detection circuit 250 and the integrating ADC 260. In an alternative embodiment, the current integration functionality may be performed by instructions executed by the processing system 160. The outputs of the calibration circuit 240 and the calibration circuit 270 are sent to the battery health gauge 100 for estimation of battery health.

In one embodiment, the measurements made by the measurement circuits 120 are collected at trigger points. A trigger point is a time instant at which a trigger condition is met. The trigger conditions may be defined in the measurement rules 190 (FIG. 1). A measurement may be collected at a start trigger point and another measurement may be collected at an end trigger point. Additional measurements may be made between the start and the end trigger points. In the time period between the start and the end trigger points, the battery is continuously being charged/discharged. A measurement is made after the battery is suspended (i.e., no operation) to stabilize the voltage. Each measurement may include a number of component measurements; e.g., a voltage measurement, a temperature measurement, and/or a current measurement. The measurement circuit 120 outputs the measurements to the battery health gauge 100 for estimation of battery health.

The battery health gauge 100 determines an initial SOC at a start trigger point and a final SOC at an end trigger point. The initial SOC and the final SOC may be determined from the battery voltage and temperature measurements as well as from the battery parameters 141 (FIG. 1) that indicate the relationship between battery voltage and the SOC of a new battery under a given temperature. The coulomb counting result indicates the battery capacity change from the initial SOC to the final SOC.

In one embodiment, the battery health gauge 100 includes a computation module 310 to calculate the maximum available capacity (Cmax) of the battery 180 at the present time based on the battery capacity change and the SOC change. For example, Cmax can be calculated as the ratio of the battery capacity change to the SOC change from the start trigger point to the end trigger point. The computation module 310 can further compute the ratio of Cmax to the battery's rated capacity to obtain the SOH. The computation module 310 may average multiple measurements collected over multiple charging/discharging cycles to compute the SOH. In one embodiment, the computation module 310 may average K measurements having the highest scores (K being a predetermined integer number). In one embodiment, each measurement is given a timestamp indicating the time when the measurement is collected. The computation module 310 may average the K highest-scoring measurements collected in the past T time units. The computation module 310 then sends the SOH as an indication of batter health to a display 350.

The battery health gauge 100 may further include a compensation module 320 to compensate for battery aging, battery temperature, and/or battery loading. In one embodiment, the compensation module 320 reads the measurements 142 from the memory system 140 and adaptively corrects the battery parameters 141. The battery parameters 141 may include zero-current voltage (ZCV), depth of discharge (DOD), internal resistance, and maximum available capacity (Cmax) with respect to different temperatures. In one embodiment, the compensation module 320 may calculate the compensation using the measurements 142 according to their assigned scores. The computation module 310 computes the SOC and SOH estimations based on the output of the compensation module 320.

With respect to temperature compensation, the compensation module 320 may interpolate the battery parameters 141 for different temperatures to obtain the battery parameters for the measured temperature, such that the computation module 310 can compute the SOC and SOH more accurately.

With respect to loading compensation, the compensation module 320 may use the DOD information in conjunction with the average discharge current of the battery 180 to determine a loading factor that reflects the instant loading of the battery 180, and thereby compensating for the SOC computation based on the loading factor.

With respect to aging compensation, the compensation module 320 calculates the differences in the internal resistance of the battery 180 between the stored battery parameters 141 and the actual condition estimated from the measurements. The compensation module 320 accordingly determines an aging factor and uses the aging factor to adjust the battery parameters 141.

Referring to FIG. 1 and FIG. 2, the battery health gauge 100 may further include a score assignment module 330 which uses a set of scoring rules (e.g., scoring rules stored in the score table 170) to assign a score to each of the measurements 142. The score assignment module 330 applies one or more scoring rules to a measurement and, for each applicable scoring rule, assigns a corresponding per-factor quality point to the measurement. The sum of all the per-factor quality points is the score assigned to that measurement. For example, a measurement may include battery temperature data (from which a battery temperature range is calculated) and current data (from which average current is calculated). If the measured battery temperature range is smaller than the battery temperature range specified in a scoring rule, the measurement may be assigned a per-factor quality point of 100 for battery temperature. If the average current is greater than the average current specified in another scoring rule, the measurement may be assigned a per-factor quality point of −50. In this example, the assigned (i.e., overall) score of that measurement is equal to the sum of 100, −50, and the per-factor quality points of other applicable scoring rules (if there are any).

The battery health gauge 100 may further include an update module 340 to detect an update indication for updating the score table 170. The update indication indicates that the score table 170 may contain outdated information, or an upgrade is available for the score table 170. The update module 340 may update the scoring rules during the lifetime of the battery based on an analysis of the measurements. The update module 340 detects an update indication from battery data or measurements collected over time. Non-limiting examples of the battery data or measurements may include the following: battery capacity range, battery temperature, coulomb counting difference range, the number of charging/discharging cycles, average current, zero-current voltages (e.g., ZCV1 and ZCV2), OCV trigger time (which is when the device 150 collects battery data or measurements), execution time length, suspend time length, device operation mode (e.g., fly mode), etc. Thus, the score table 170 does not stay static but is adaptable to the changes in the battery characteristics as the battery ages.

In one embodiment, the update module 340 may perform an analysis on the measurements 142 to detect an update indication and to calculate an update to the score table 170 based on the analysis. Alternatively or additionally, the battery health gauge 100 may upload the measurements 142 to a server system for the server system to perform the analysis. The server system then sends the device 150 an update to the score table 170. The uploading of the measurements 142 may be performed periodically, intermittently, or on-demand. In one embodiment, the server system may perform the analysis based on the measurements from multiple batteries of the same model and/or similar age to calculate a score update, and download the score update to the devices installed with these batteries. The device 150 may select the updates relevant to its battery 180 to update its score table 170.

Figure 3:
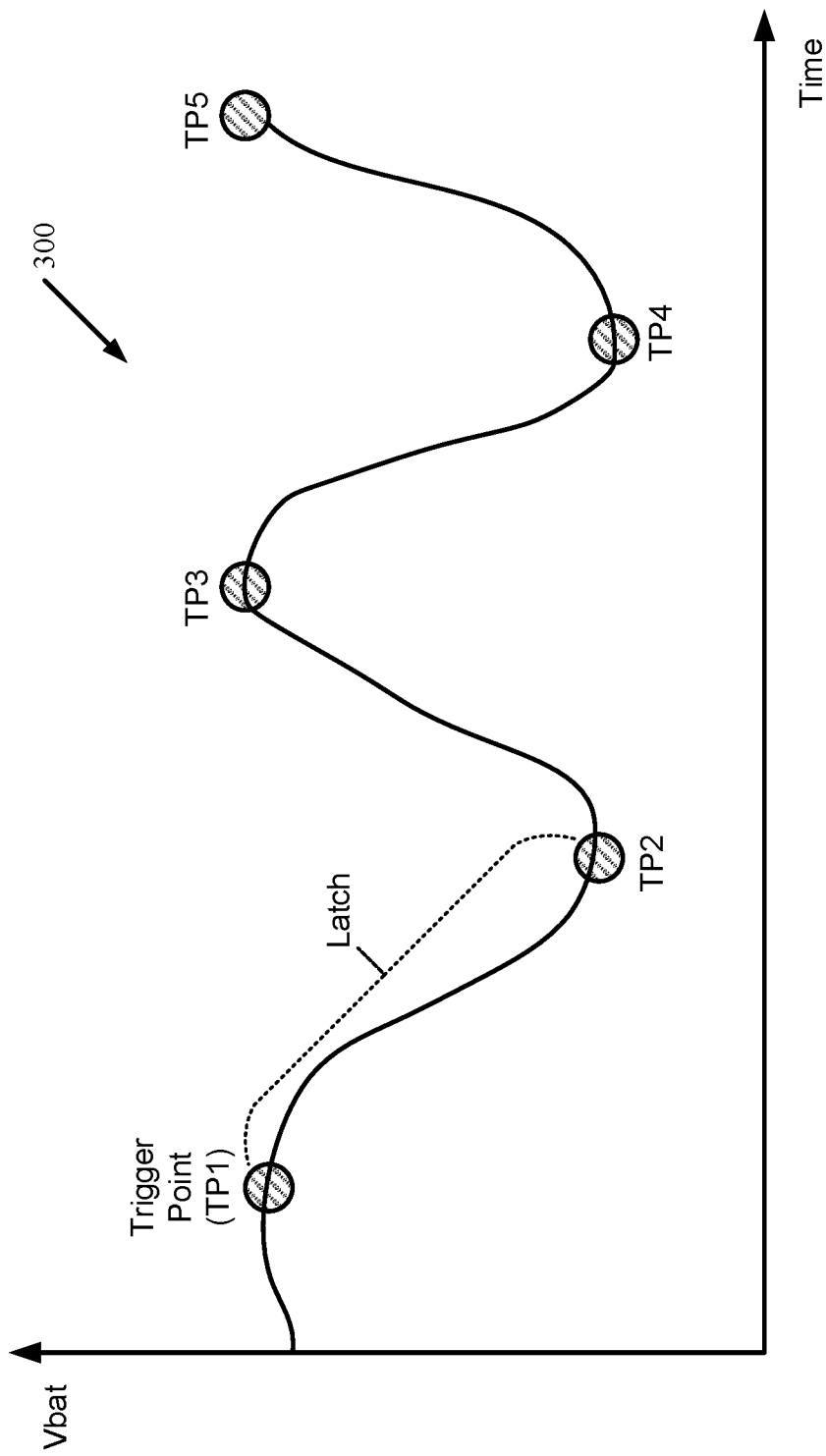
FIG. 3 illustrates examples of trigger points for collecting battery measurements according to one embodiment.

FIG. 3 is a diagram 300 illustrating examples of trigger points for collecting battery measurements (e.g., the measurements 142 in FIG. 1). The diagram 300 shows the relationship between battery voltage (Vbat) and time. The trigger points mark the time instants or time periods for collecting battery measurements. For example, a first trigger point (TP1) is a start trigger point marking the beginning of a measurement period (a.k.a. initial latch), and a second trigger point (TP2) is an end trigger point marking the end of the measurement period (a.k.a. finish latch). In one embodiment, the measurement circuit 120 measures the battery voltage and the temperature at TP1 and TP2, and performs coulomb counting from TP1 to TP2. In one embodiment, additional measurements may be made at other time instants between TP1 and TP2.

Each trigger point is a time instant at which a predefined trigger condition is met. For example, one trigger condition may be the battery fully charged and suspended for 30 minutes. Another trigger condition may be the battery fully discharged and suspended for 30 minutes. Yet another trigger condition may specify the SOC (e.g., SOC=30% or 70%) and a suspend time of N minutes. The suspend time may be included as part of a trigger condition such that the battery is rested and its voltage stabilized after a charging or discharging process.

FIG. 4 illustrates an example of a set of measurement rules (e.g., the measurement rules 190 in FIG. 1) according to one embodiment. The measurement rules define a set of trigger conditions for collecting battery measurements, such as voltage, temperature, and current measurements. The battery health gauge 100 uses the measurement rules to identify trigger conditions. In one embodiment, a trigger condition indicates a given capacity of the battery and a given length of battery suspend time.

FIG. 5 illustrates an example of a score table (e.g., the score table 170 in FIG. 1) according to one embodiment. The score table is used to assign a score to each measurement collected based on the measurement rules 190. The score table defines a set of scoring rules for scoring the measurements. The scoring rules specify scoring factors and corresponding per-factor quality points (e.g., P1-P9, each of which represents a number) from which the assigned score is calculated. Each scoring factor indicates an operation characteristic of the battery, where the operation characteristic can be calculated from the measurements, or can be an operation mode of the battery. Examples of the scoring factors include, but are not limited to: whether the device is in a fly mode when the measurement is taken, execution time length (charging/discharging time length), suspend time length (the time length of suspending battery operation at a measurement trigger point), the number of charging and/or discharging cycles that the battery has completed, battery temperature range (change in battery temperature in a measurement period), battery capacity range (change in battery capacity in a measurement period; e.g., from 30% to 70% in a charging cycle), an average current range in a measurement period, a voltage range in a measurement period, and a coulomb difference range in a measurement period; e.g., from 2300 mAh to 3000 mAh in a charging cycle). A battery measurement can be disregarded when the measurement has an assigned score below a predetermined threshold. The battery health gauge 100 may use an average of multiple measurements to estimate the SOC and the SOH of the battery.

Figure 6:
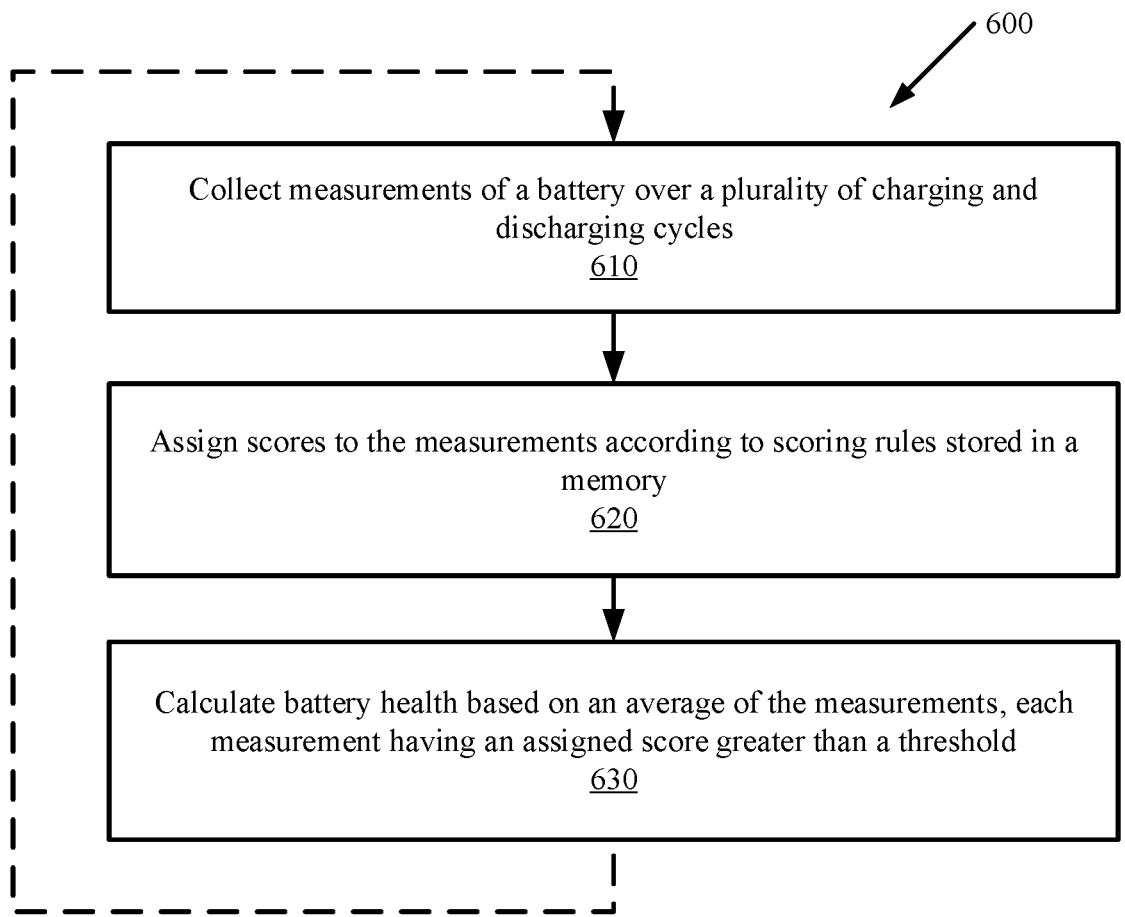
FIG. 6 is a flow diagram illustrating a method for estimating battery health according to one embodiment.

FIG. 6 is a flow diagram illustrating a method 600 for estimating battery health according to one embodiment. For example, the method 600 may be performed by any of the embodiments described in connection with FIGS. 1 and 2. It is understood that the embodiments are for illustrative purposes only; other devices or circuits may perform the method 600.

The method 600 begins at step 610 when a device collects measurements of a battery over a plurality of charging and discharging cycles. At step 620 the device assigns scores to the measurements according to scoring rules stored in a memory. The device at step 630 calculates battery health based on an average of the measurements. Each measurement used in the calculation has an assigned score greater than a threshold. In one embodiment, the device may repeat steps 610-630 during the lifespan of the battery.

In one embodiment, the updating of the score table may be performed after the battery has been in use for a period of time and multiple cycles of battery measurements have been collected and analyzed. In one embodiment, the device may perform the analysis on the measurements to detect an update indication. Alternatively, the device may upload the measurements to a server system, which performs the analysis on the measurement and other measurements from other devices to determine an update to the score table. In addition to updating the score table, in one embodiment the update may further include an update to the measurement rules 190 (FIG. 1) and/or battery parameters 141 (FIG. 1).

The operations of the flow diagram of FIG. 6 have been described with reference to the exemplary embodiments of FIGS. 1 and 2. However, it should be understood that the operations of the flow diagram of FIG. 6 can be performed by embodiments of the invention other than the embodiments of FIGS. 1 and 2, and the embodiments of FIGS. 1 and 2 can perform operations different than those discussed with reference to the flow diagram. While the flow diagram of FIG. 6 shows a particular order of operations performed by certain embodiments of the invention, it should be understood that such order is exemplary (e.g., alternative embodiments may perform the operations in a different order, combine certain operations, overlap certain operations, etc.).

Embodiments of the present invention may be implemented as an apparatus, a method, or a computer program product stored in a computer-readable medium. Accordingly, these embodiments may be implemented with entire hardware combinations, entire software combinations, such as software, firmware, instructions, microcodes, or mixing of software and hardware combinations. In the disclosure herein, all the possible combinations are referred to as a "gauge" a "module", or a "system".

While the invention has been described in terms of several embodiments, those skilled in the art will recognize that the invention is not limited to the embodiments described, and can be practiced with modification and alteration within the spirit and scope of the appended claims. The description is thus to be regarded as illustrative instead of limiting.

What is claimed is:

1. A method for a device to estimate battery health, comprising:
   collecting measurements of a battery over a plurality of charging and discharging cycles;
   assigning scores to the measurements according to scoring rules stored in a memory of the device;
   calculating battery health based on an average of the measurements, each measurement having an assigned score greater than a threshold; and
   updating the scoring rules and measurement rules based on an analysis of the measurements during lifetime of the battery, wherein the measurement rules are used to adjust trigger conditions that define when to collect the measurements.

2. The method of claim 1, further comprising:
   adding new scoring rules tailored to the device or device usage during lifetime of the battery based on the analysis of the measurements.

3. The method of claim 1, wherein updating the scoring rules further comprises:
   uploading the measurements from the device to a server system to perform the analysis; and
   receiving an update to the scoring rules from the server system, wherein the update is based on the analysis of uploaded measurements of multiple batteries.

4. The method of claim 1, wherein updating the scoring rules further comprises:
   performing, by the device, the analysis on the measurements;
   detecting an update indication based on the analysis; and
   generating additional scoring rules based on the analysis.

5. The method of claim 1, wherein the scoring rules specify scoring factors and corresponding per-factor quality points from which the assigned score is calculated, and wherein each scoring factor indicates an operation characteristic of the battery.

6. The method of claim 5, further comprising:
   calculating the assigned score by summing up the corresponding per-factor quality points.

7. The method of claim 1, wherein assigning the scores further comprises:
   calculating a measured battery temperature range in a charging or discharging cycle; and
   comparing the measured battery temperature range with a battery temperature range specified in the scoring rules to obtain a first per-factor quality point, based on which the assigned score is calculated.

8. The method of claim 1, wherein assigning the scores further comprises:
   calculating a measured battery capacity range in a charging or discharging cycle; and
   comparing the measured battery capacity range with a battery capacity range specified in the scoring rules to obtain a second per-factor quality point, based on which the assigned score is calculated.

9. The method of claim 1, wherein assigning the scores further comprises:
   calculating a measured time length for performing a charging or discharging cycle; and
   comparing the measured time length with an execution time length specified in the scoring rules to obtain a third per-factor quality point, based on which the assigned score is calculated.

10. The method of claim 1, wherein assigning the scores further comprises:
    calculating a measured suspend time length at a start or an end of a charging or discharging cycle; and
    comparing the measured suspend time length with a suspend time length specified in the scoring rules to obtain a fourth per-factor quality point, based on which the assigned score is calculated.

11. The method of claim 1, wherein assigning the scores further comprises:
    calculating a measured number of the charging and discharging cycles that the battery has completed; and
    comparing the measured number with a cycle number specified in the scoring rules to obtain a fifth per-factor quality point, based on which the assigned score is calculated.

12. The method of claim 1, wherein assigning the scores further comprises:
    calculating a measured average current range in a charging or discharging cycle; and
    comparing the measured average current range with an average current range specified in the scoring rules to obtain a sixth per-factor quality point, based on which the assigned score is calculated.

13. The method of claim 1, wherein assigning the scores further comprises:
    calculating a measured voltage range in the charging or discharging cycle; and
    comparing the measured voltage range with a voltage range specified in the scoring rules to obtain a seventh per-factor quality point, based on which the assigned score is calculated.

14. The method of claim 1, wherein assigning the scores further comprises:
    determining whether a fly mode of the device is enabled when one or more of the measurements are taken.

15. A device operative to estimate battery health, comprising:
    a battery;
    a measurement system to collect measurements of the battery over a plurality of charging and discharging cycles;
    memory to store scoring rules; and
    a processing system operative to:
       assign scores to the measurements according to scoring rules stored in the memory;
       calculate battery health based on an average of the measurements, each measurement having an assigned score greater than a threshold; and
       update the scoring rules and measurement rules based on an analysis of the measurements during lifetime of the battery, wherein the measurement rules are used to adjust trigger conditions that define when to collect the measurements.

16. The device of claim 15, wherein the processing system is further operative to add new scoring rules tailored to the device or device usage during lifetime of the battery based on the analysis of the measurements.

17. The device of claim 15, wherein the scoring rules specify scoring factors and corresponding per-factor quality points from which the assigned score is calculated, and wherein each scoring factor indicates an operation characteristic of the battery.

18. The device of claim 17, wherein the scoring factors include one or more of: a battery temperature range, a battery capacity range, an average current range, and a voltage range.

19. The device of claim 17, wherein the scoring factors include one or more of: execution time length, suspend time length, and a number of cycles that the battery has completed.

20. The device of claim 17, wherein the scoring factors include whether a fly mode of the device is enabled when one or more of the measurements are taken.

* * * * *